(12) United States Patent
Jang et al.

(10) Patent No.: US 8,115,550 B2
(45) Date of Patent: Feb. 14, 2012

(54) TRANSMITTER

(75) Inventors: Dae-Joong Jang, Anyang-si (KR);
Wook-Hee Park, Gangnam-gu (KR);
Young-Bin Yoon, Songpa-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 148 days.

(21) Appl. No.: 12/643,638

(22) Filed: Dec. 21, 2009

(65) Prior Publication Data
US 2010/0164623 A1 Jul. 1, 2010

(30) Foreign Application Priority Data
Dec. 31, 2008 (KR) .................. 10-2008-0138065

(51) Int. Cl.
*H03F 3/45* (2006.01)
(52) U.S. Cl. ........................... 330/253; 330/251
(58) Field of Classification Search .......... 330/69, 330/253, 255
See application file for complete search history.

(56) References Cited

U.S. PATENT DOCUMENTS 6,930,550 B1 * 8/2005 Wu .............................. 330/255
7,974,589 B2 * 7/2011 Jeffries et al. .................. 330/253

* cited by examiner

*Primary Examiner* — Khanh Nguyen
(74) *Attorney, Agent, or Firm* — Sherr & Vaughn, PLLC

(57) ABSTRACT

A transmitter for supplying a large current upon phase change of an output voltage is disclosed. The transmitter includes a first amplifying unit including a first amplifier including first NMOS and PMOS transistors connected by a common source thereof, and a second amplifier including a second PMOS and NMOS transistors connected by a common drain thereof while being connected with the first amplifier in parallel, a second amplifying unit including a third amplifier including third NMOS and PMOS transistors connected by a common source thereof, and a fourth amplifier including fourth PMOS and NMOS transistors connected by a common drain thereof while being connected with the third amplifier in parallel, and differential output nodes including a positive node connected to an output stage of the first amplifying unit, to which the common source of the first amplifier and the common drain of the second amplifier are connected, and a negative node connected to an output stage of the second amplifying unit, to which the common source of the third amplifier and the common drain of the fourth amplifier are connected.

20 Claims, 10 Drawing Sheets

Output Waveform: Driving Period

Figure 6A:
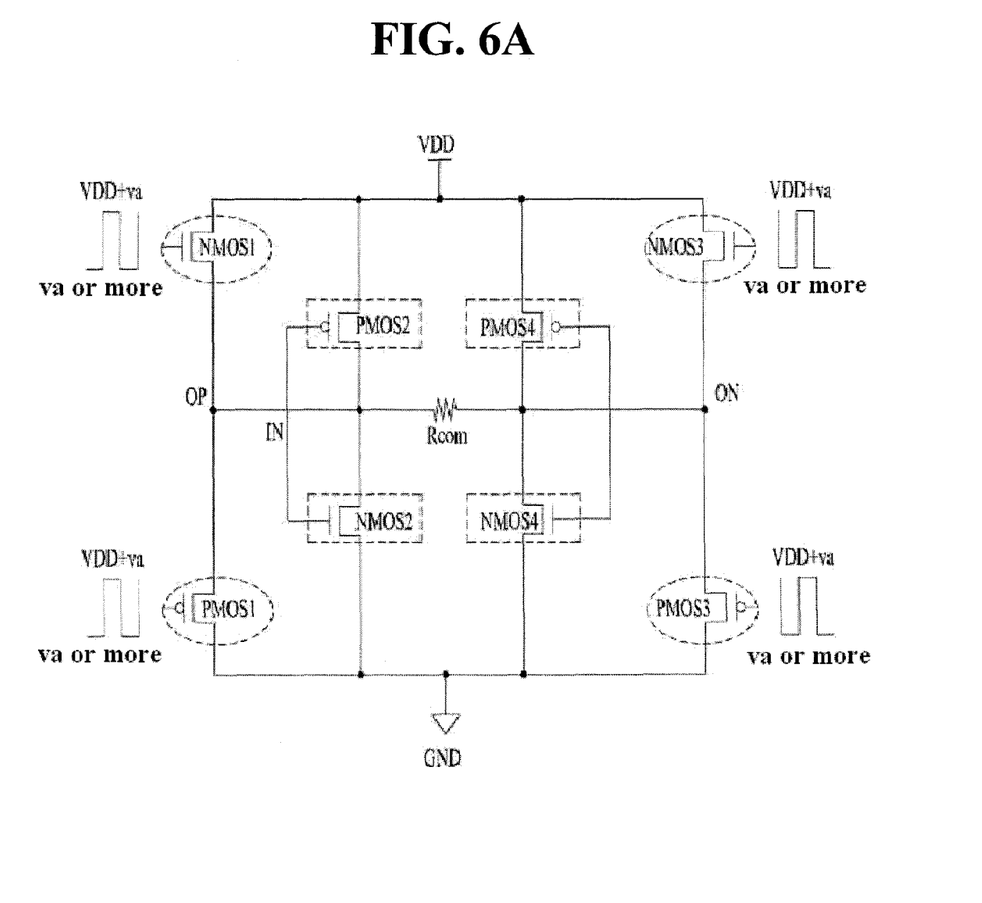
FIG. 6A is a circuit diagram illustrating a transmitter structure according to embodiments.
Figure 6B:
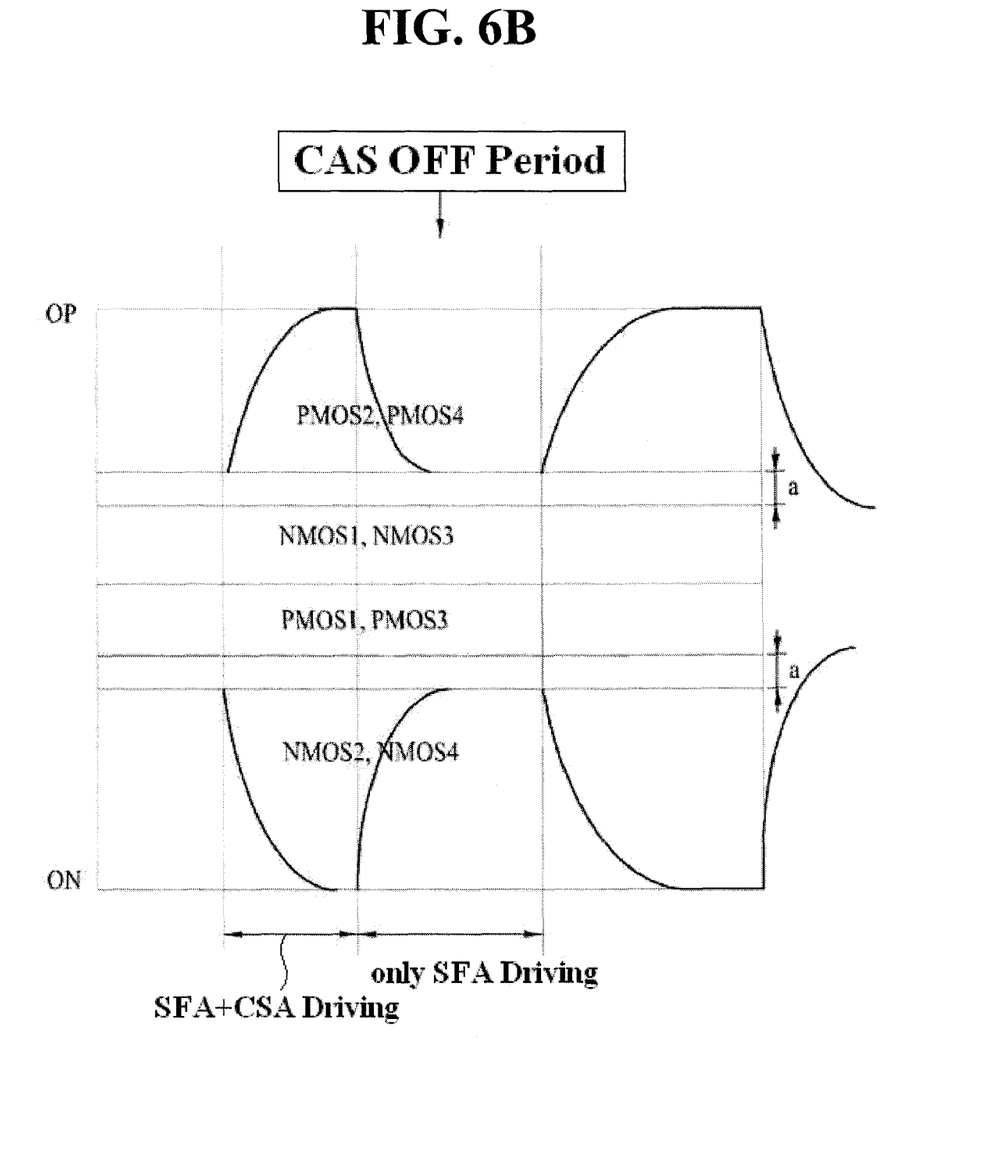
FIG. 6B is a diagram illustrating driving waveforms according to the circuit of example FIG. 6A.

FIG. 6B ured across the resistor Rterm by the constant current supplied to the positive node 1 and negative node 2. The constant voltage applied across the resistor Rterm is detected by a comparator 3. Meanwhile, the related transmitter additionally includes a common-mode feedback circuit to fix a common-mode voltage at a voltage vcom because the common-mode noise at the positive node 1 and negative node 2 is high.

TRANSMITTER

The present application claims priority under 35 U.S.C. 119 to Korean Patent Application No. 10-2008-0138065 (filed on Dec. 31, 2008), which is hereby incorporated by reference in its entirety.

BACKGROUND

Figure 1:
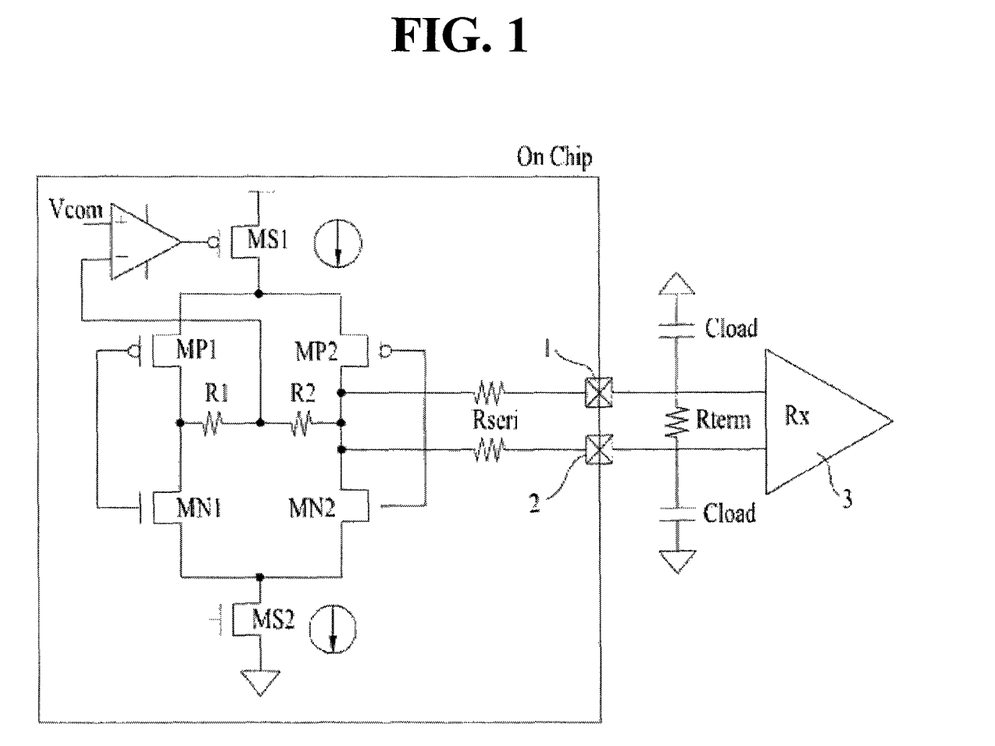
FIG. 1 is a circuit diagram illustrating a related transmitter having a push-pull structure.

FIG. 1 is a circuit diagram illustrating a related transmitter having a push-pull structure. FIG. 1 illustrates a circuit of the transmitter, which has a double stack structure driven in a push-pull manner.

Referring to FIG. 1, an MS1, which is a PMOS transistor, and an MS2, which is an NMOS transistor, are used as constant current sources. PMOS transistors MP1 and MP2, and NMOS transistors MN1 and MN2 are switching elements to determine the direction of current flow. The MP2 and MN1 are simultaneously turned on, and the MP1 and MN2 are simultaneously turned on, thereby supplying a constant current to a positive node 1 and a negative node 2.

A constant voltage is applied across a resistor Rterm by the constant current supplied to the positive node 1 and negative node 2. The constant voltage applied across the resistor Rterm is detected by a comparator 3. Meanwhile, the related transmitter additionally includes a common-mode feedback circuit to fix a common-mode voltage at a voltage vcom because the common-mode noise at the positive node 1 and negative node 2 is high.

The above-mentioned circuit of the related transmitter has three problems as follows. First, although voltage drop occurs at the MS1, MP2, resistor Rterm, resistor Rseri, MN2, and MS2 when the voltage at the positive node 1 is driven to be increased to a level higher than the voltage vcom, high voltage drop occurs at the resistive elements, namely, the MP2, Rterm, Rseri, and MN2 when the driving is achieved using a large current. For this reason, the voltage to be secured in the MS1 and MS2 becomes insufficient. As a result, it is difficult for the MS1 and MS2 to be driven as constant current sources. When the MP1 and MP2 cannot operate as large current sources, it is impossible to supply a large current to a capacitive load, namely, a capacitor Cload. When this happens, it may be impossible to achieve high-speed data transmission.

Second, a lot of time is needed for phase change of the voltage applied across the resistor Rterm when a large capacitive load, for example, the capacitor Cload, is driven. For this reason, it is impossible to charge the capacitor Cload to a normal voltage level in a high-speed operation. To solve this problem, it is necessary to supply a large current to the positive node 1 and negative node 2 upon changing the phase of the above-mentioned voltage. However, the amount of current is limited by the constant current sources. As a result, there is a problem in that it is difficult to achieve rapid phase change at the positive node 1 and negative node 2.

Third, it may be necessary to add the common-mode feedback circuit because the noise at the voltage vcom is high due to high output resistance of the positive node 1 and negative node 2.

SUMMARY

Embodiments relate to a transmitter, and more particularly, to a transmitter for supplying a large current upon phase change of an output voltage. Embodiments relate to a transmitter capable of achieving high-speed operation by supplying a large current upon phase change of an output voltage. Embodiments relate to a transmitter requiring no common-mode feedback circuit.

Embodiments relate to a transmitter which may include a first amplifying unit including a first amplifier including a first NMOS transistor and a first PMOS transistor, which have a common source connecting the first NMOS transistor and the first PMOS transistor, and a second amplifier including a second PMOS transistor and a second NMOS transistor, which have a common drain connecting the second PMOS transistor and the second NMOS transistor, while being connected with the first amplifier in parallel, a second amplifying unit including a third amplifier including a third NMOS transistor and a third PMOS transistor, which have a common source connecting the third NMOS transistor and the third PMOS transistor, and a fourth amplifier including a fourth PMOS transistor and a fourth NMOS transistor, which have a common drain connecting the fourth PMOS transistor and the fourth NMOS transistor, while being connected with the third amplifier in parallel, and differential output nodes including a positive node connected to an output stage of the first amplifying unit, to which the common source of the first amplifier and the common drain of the second amplifier are connected, and a negative node connected to an output stage of the second amplifying unit, to which the common source of the third amplifier and the common drain of the fourth amplifier are connected.

A drain of the first NMOS transistor and a source of the second PMOS transistor may be connected to a voltage supply stage. A drain of the first PMOS transistor and a source of the second NMOS transistor may be connected to a ground stage. A drain of the third NMOS transistor and a source of the fourth PMOS transistor may be connected to the voltage supply stage. A drain of the third PMOS transistor and a source of the fourth NMOS transistor may be connected to the ground stage. The output stage of the first amplifying unit and the output stage of the second amplifying unit may be connected to each other, thereby forming a mirror.

The transmitter may further include a resistor having opposite ends, to which the output stage of the first amplifying unit and the output stage of the second amplifying unit are connected, respectively. The output stage of the first amplifying unit and the output stage of the second amplifying unit may be connected to the opposite ends of the resistor, respectively, thereby forming a mirror.

A gate of the first NMOS transistor and a gate of the first PMOS transistor may be connected to each other. A gate of the third NMOS transistor and a gate of the third PMOS transistor may be connected to each other.

The transmitter may further include first and second switches respectively arranged at a gate of the second PMOS transistor and a gate of the second NMOS transistor, to turn on/off the second amplifier, and third and fourth switches respectively arranged at a gate of the fourth PMOS transistor and a gate of the NMOS transistor, to turn on/off the fourth amplifier.

A gate of the first NMOS transistor and a gate of the first PMOS transistor may be connected to each other. A gate of the third NMOS transistor and a gate of the third PMOS transistor may be connected to each other. A gate of the second PMOS transistor and a gate of the second NMOS transistor may be connected to each other. A gate of the fourth PMOS transistor and a gate of the fourth NMOS transistor may be connected to each other.

The transmitter may further include fifth and sixth switches for turning on/off the second amplifier, seventh and eighth switches for turning on/off the fourth amplifier. The fifth switch may be arranged between a source of the second PMOS transistor and a voltage supply stage. The sixth switch may be arranged between a source of the second NMOS transistor and a ground stage. The seventh switch may be arranged between a source of the fourth PMOS transistor and the voltage supply stage. The eighth switch may be arranged between a source of the fourth NMOS transistor and the ground stage.

DRAWINGS

Example

Example

Example

Example

Example

Example

Example

Example

Example

Example

DESCRIPTION

Figure 2A:
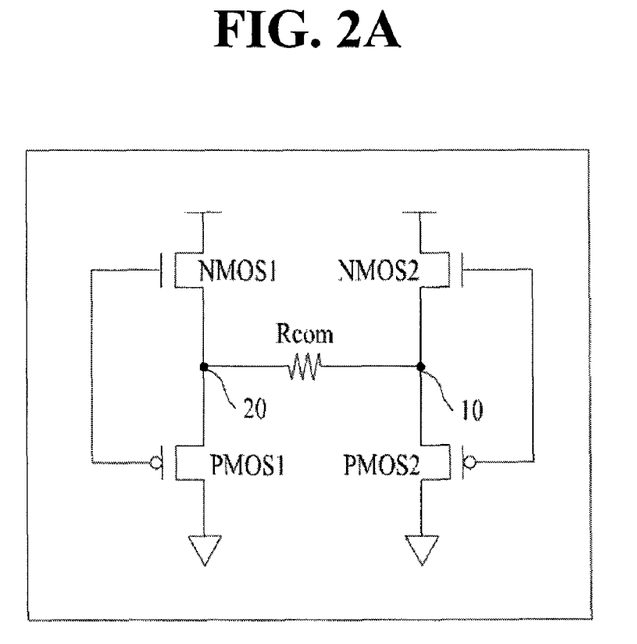
FIG. 2A is a circuit diagram illustrating a structure of a source follower amplifier (SFA) applied to embodiments.
Figure 2B:
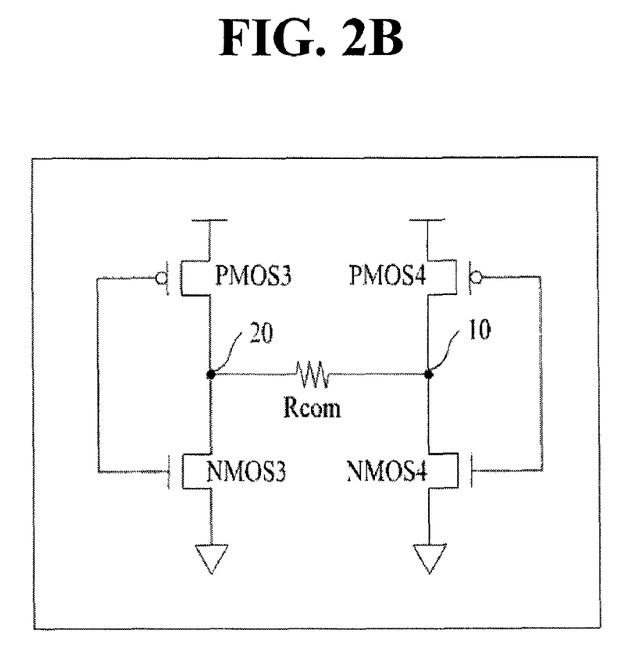
FIG. 2B is a circuit diagram illustrating a structure of a common source amplifier (CSA) applied to embodiments.

Example FIG. 2A is a circuit diagram illustrating a structure of a source follower amplifier (SFA) applied to embodiments. Example FIG. 2B is a circuit diagram illustrating a structure of a common source amplifier (CSA) applied to embodiments. The SFA shown in example FIG. 2A does not have a double stack structure, but has a single stack structure. Accordingly, the structure of the SFA can secure a desired voltage range when it operates as a current source.

The SFA may include a first amplifying unit including an NMOS1 and a PMOS1 connected to each other by a common source thereof, and a second amplifying unit connected to the first amplifying unit via a resistor Rcom, to form a mirror. The second amplifying unit includes an NMOS2 and a PMOS2, which are connected to each other by a common drain thereof while being connected with the first amplifying unit in parallel between a voltage supply stage and a ground stage.

The SFA has low impedance at output stages 10 and 20, so that it generates low common-mode noise. In addition, there is an advantage in that the common mode is self-biased. Accordingly, it is unnecessary to use an additional common-mode feedback circuit.

However, the SFA has a drawback in that it is impossible to obtain high voltage drop across a differential output resistor Rterm because the SFA cannot supply a high current to the output stages due to a low amplification gain thereof.

The CSA shown in example FIG. 2B is an amplifier having a common source structure. Similar to the SFA, the CSA does not have a double stack structure, but has a single stack structure. Accordingly, the structure of the CSA can secure a desired voltage range when it operates as a current source.

Using the CSA, it is possible to achieve large-current driving because it is possible to greatly increase the gate-source voltage Vgs of the transistor upon phase change of an output voltage. In this case, however, it is necessary to use a common-mode feedback circuit because the CSA generates high common-mode noise in that it exhibits high resistance at the output stage thereof.

Figure 3A:
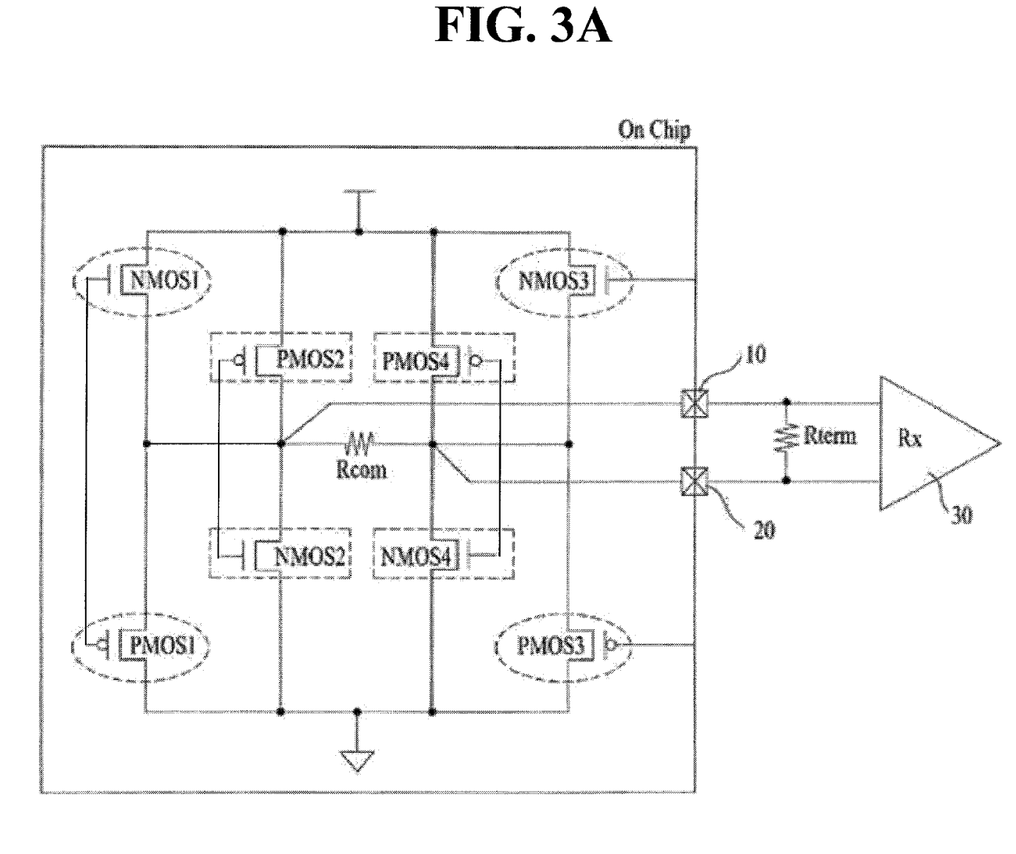
FIG. 3A is a circuit diagram illustrating a basic transmitter structure according to embodiments.
Figure 3B:
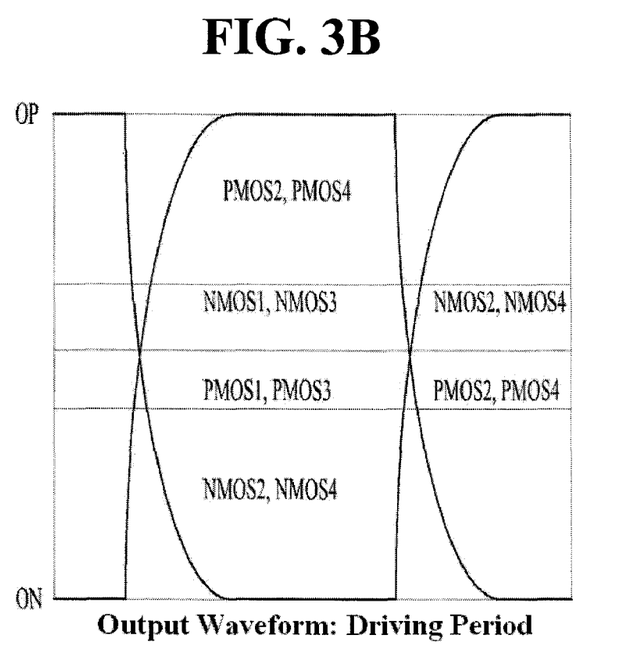
FIG. 3B is a diagram illustrating driving waveforms according to the circuit of example FIG. 3A.

Example FIG. 3A is a circuit diagram illustrating a basic transmitter structure according to embodiments. Example FIG. 3B is a diagram illustrating driving waveforms according to the circuit of example FIG. 3A. The basic transmitter shown in example FIG. 3A has a structure in which the SFA of example FIG. 2A and the CSA of example FIG. 2B are coupled in parallel. Where the SFA and CSA are coupled, as in embodiments, synergy effects are obtained as the advantages of the SFA and CSA are combined.

Hereinafter, the transmitter shown in example FIG. 3A will be described in detail. The transmitter may include first and second amplifying units connected to each other via a resistor Rcom, thereby forming a mirror. The first amplifying unit may be connected, at an output stage thereof, to one end of the resistor Rcom. The second amplifying unit may be connected, at an output stage thereof, to the other end of the resistor Rcom.

The first amplifying unit may include a first amplifier including an NMOS1 and a PMOS1 connected to each other by a common source thereof, and a second amplifier including a PMOS2 and an NMOS2 connected to each other by a common drain thereof while being connected with the first amplifier in parallel. The second amplifying unit may include a third amplifier including an NMOS3 and a PMOS3 connected to each other by a common source thereof, and a fourth amplifier including a PMOS4 and an NMOS4 connected to each other by a common drain thereof while being connected with the third amplifier in parallel.

The drain of the NMOS1 and the source of the PMOS2 may be connected to a voltage supply stage, whereas the drain of the PMOS1 and the source of the NMOS2 may be connected to a ground stage. The drain of the NMOS3 and the source of the PMOS4 may be connected to the voltage supply stage, whereas the drain of the PMOS3 and the source of the NMOS4 may be connected to the ground stage.

Thus, the output stage of the first amplifying unit and the output stage of the second amplifying unit may be connected to each other, thereby forming a mirror. The gate of the NMOS1 and the gate of the PMOS1 may be connected to each other. The gate of the NMOS3 and the gate of the PMOS3 may be connected to each other. Meanwhile, the gate of the PMOS2 and the gate of the NMOS2 may be connected to each other. The gate of the PMOS4 and the gate of the NMOS4 may be connected to each other.

The transmitter may also include, as differential output nodes, a positive node 10 and a negative node 20. The positive node 10 may be connected to the output stage of the first amplifying unit, to which the common source of the first amplifier aid the common drain of the second amplifier may be connected in common. The negative node 2 may be connected to the output stage of the second amplifying unit, to which the common source of the third amplifier and the common drain of the fourth amplifier may be connected in common.

Meanwhile, a differential output resistor Rterm may be provided at a receiving stage, which receives signals from the transmitter. The differential output resistor Rterm may be connected to the positive node 10 and negative node 20 in parallel. A comparator 30 may also be provided to detect a differential output voltage applied across the differential output resistor Rterm.

Since the transmitter of example FIG. 3A has a structure in which a single CSA and a single SFA are coupled in parallel, it is possible to secure a wide voltage range, as compared to a transmitter having a double stack structure. Accordingly, it is possible to drive a large current even in a normal state.

Also, a large current can be supplied to the output stage upon phase change of an output voltage because a high voltage Vgs can be applied to the CSA. Example FIG. 3B is a diagram illustrating driving waveforms according to the circuit of example FIG. 3A. Example FIG. 3B shows waveforms at the output stages of the first and second amplifying units when differential currents IN and IP are applied as full swing inputs between a supply voltage VDD and a ground voltage GND. Meanwhile, the resistor Rcom arranged between the first and second amplifying units may be used to control the common-mode voltages at the differential output nodes to be identical to each other.

Figure 4A:
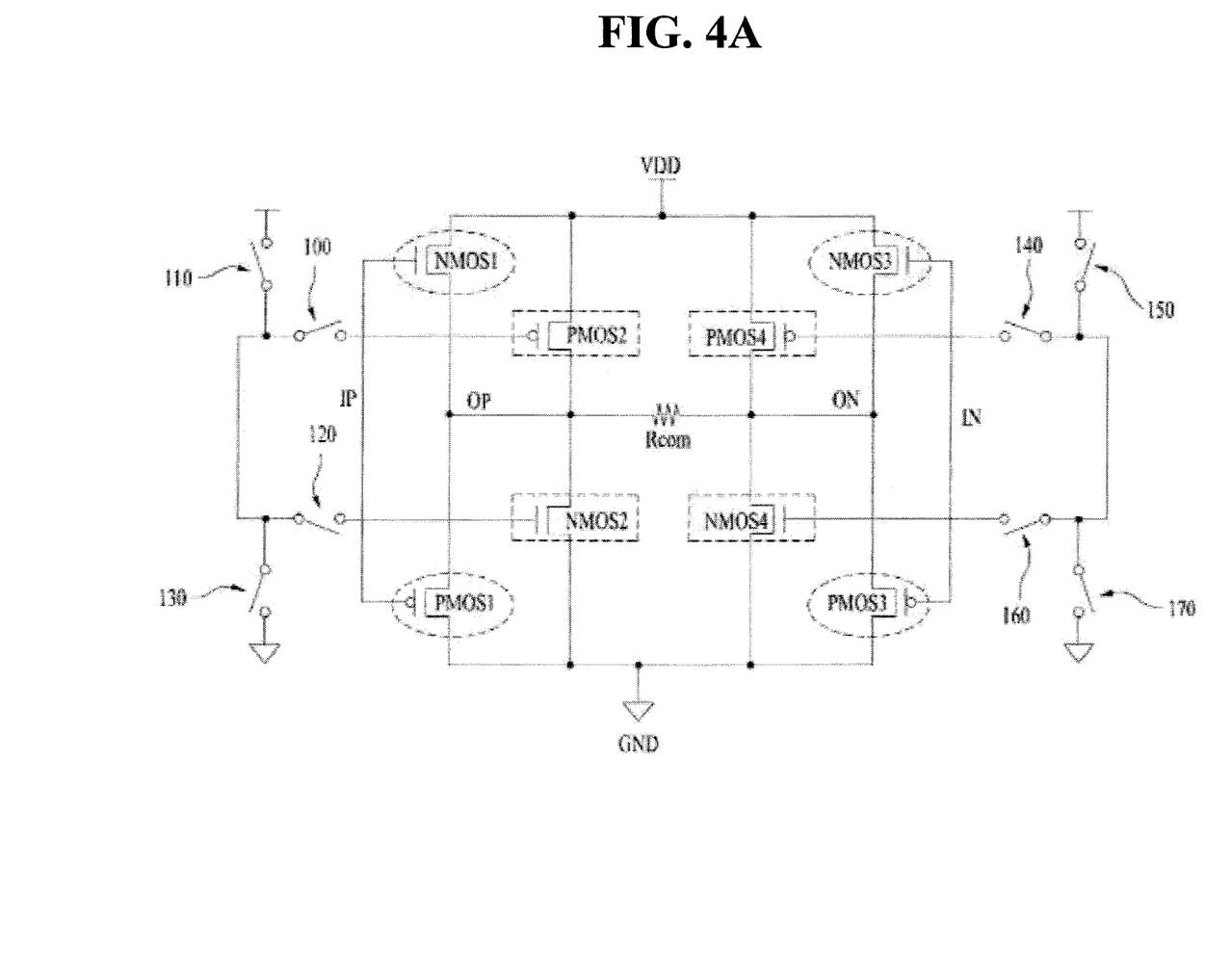
FIG. 4A is a circuit diagram illustrating a transmitter structure according to embodiments.
Figure 4B:
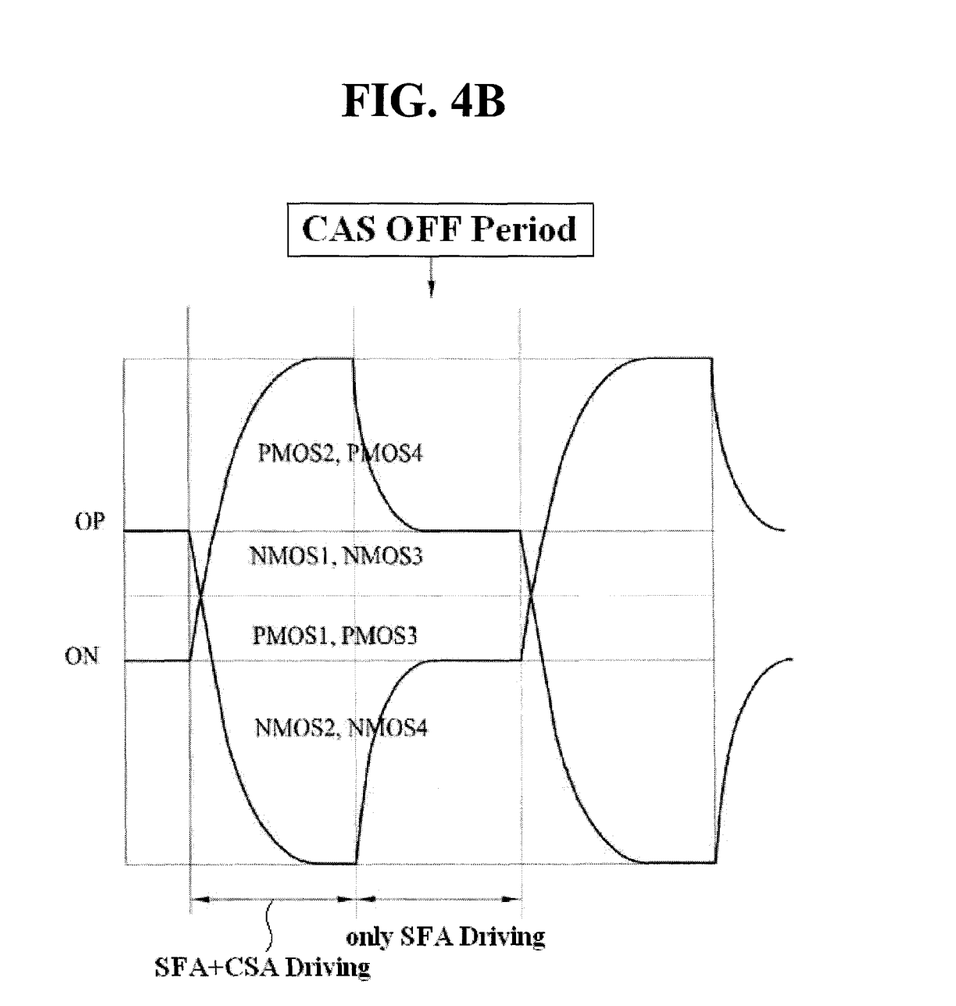
FIG. 4B is a diagram illustrating driving waveforms according to the circuit of example FIG. 4A.

Example FIG. 4A is a circuit diagram illustrating a transmitter structure according to embodiments. Example FIG. 4B is a diagram illustrating driving waveforms according to the circuit of example FIG. 4A.

The transmitter of example FIG. 4A may include, as a basic structure thereof, the structure of example FIG. 3A. The transmitter of example FIG. 4A may also include first and second switches 100 and 120 arranged at respective gates of the PMOS2 and NMOS2, to turn on/off the second amplifier, and third and fourth switches arranged at respective gates of the PMOS4 and NMOS4, to turn on/off the fourth amplifier. In this case, the gates of the PMOS1 and NMOS1 may be connected to each other, and the gates of the PMOS3 and NMOS3 may be connected to each other.

The structure of example FIG. 4A may be adapted to prevent the CSA from being in a continuous ON state after the phase change of the output voltage. When the phase change of the output voltage is completed, the CSA is turned off, and only the SFA is driven, in order to avoid unnecessary current consumption.

Figure 5A:
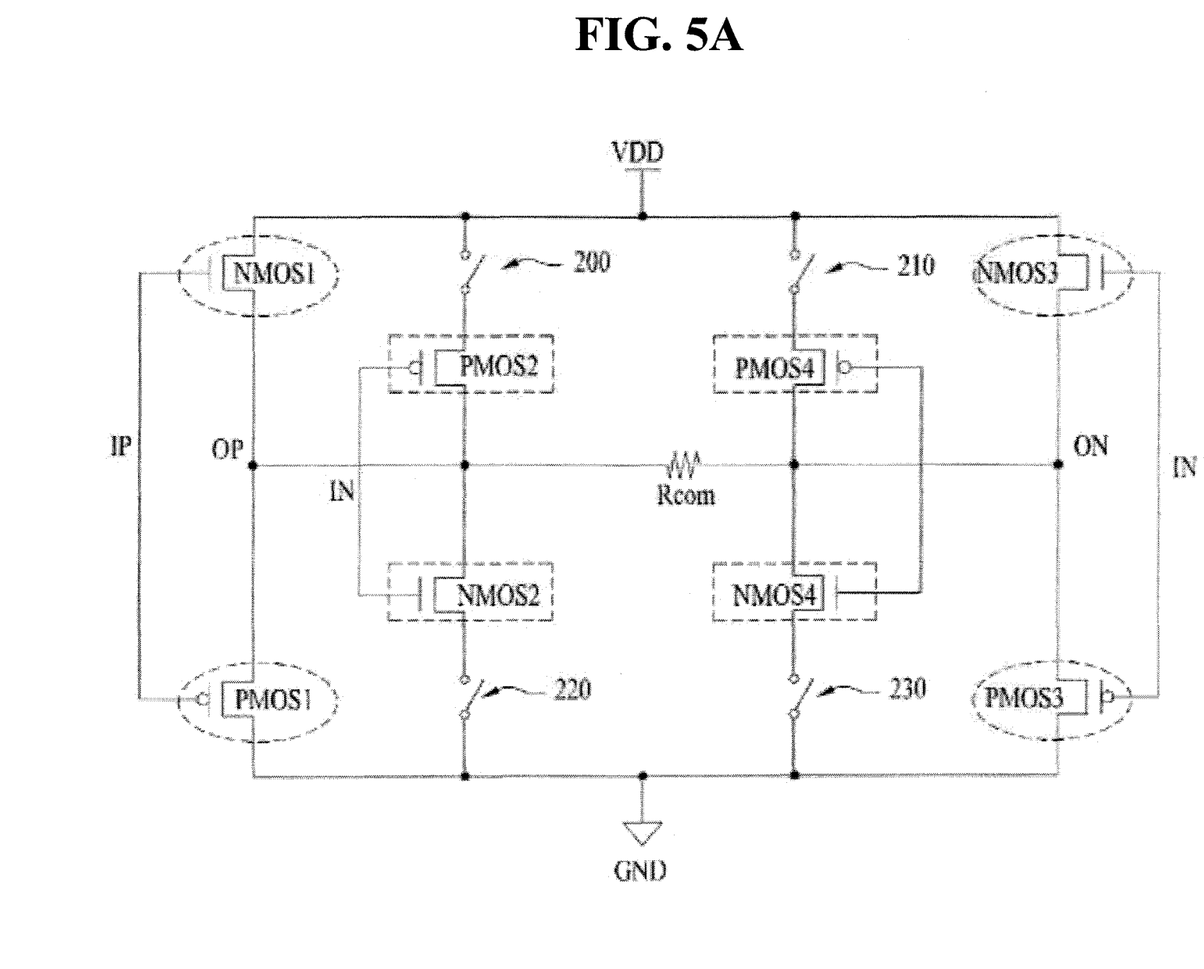
FIG. 5A is a circuit diagram illustrating a transmitter structure according to embodiments.
Figure 5B:
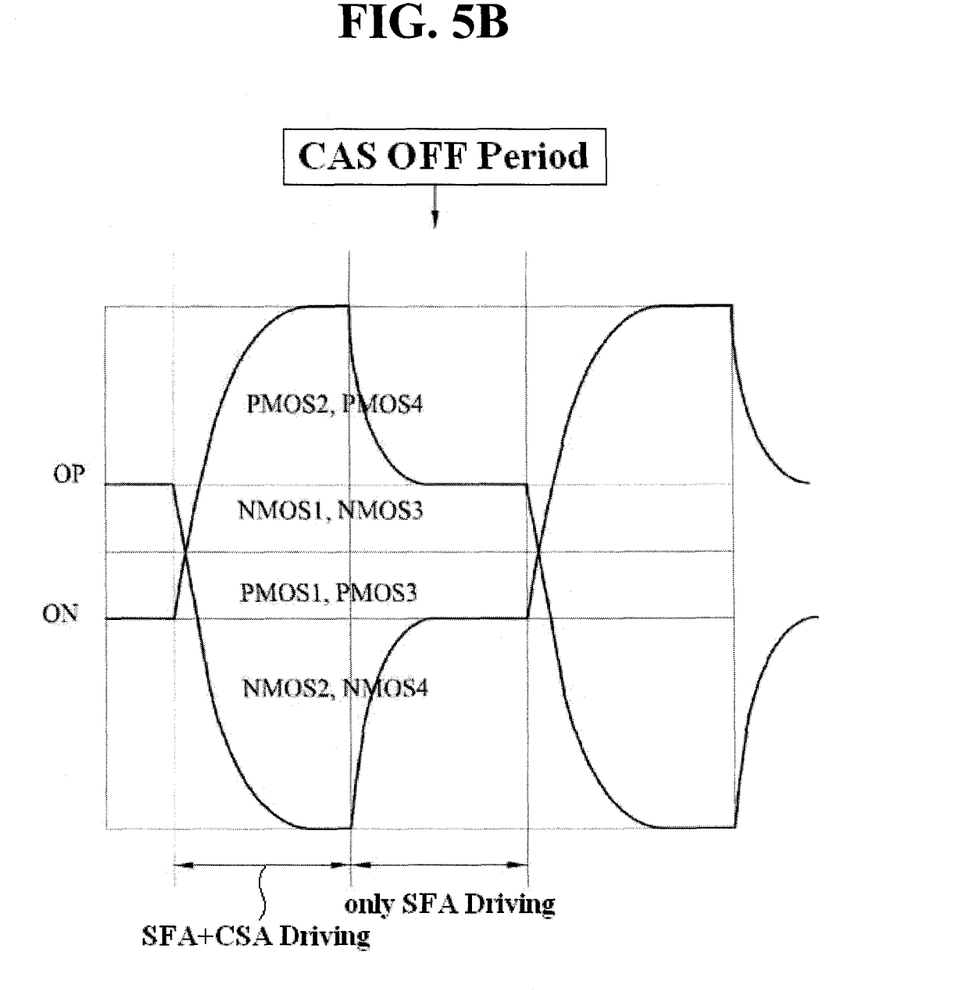
FIG. 5B is a diagram illustrating driving waveforms according to the circuit of example FIG. 5A.

Example FIG. 5A is a circuit diagram illustrating a transmitter structure according to embodiments. Example FIG. 5B is a diagram illustrating driving waveforms according to the circuit of example FIG. 5A.

The transmitter of example FIG. 5A may include, as a basic structure thereof, the structure of example FIG. 3A. The transmitter of example FIG. 5A may also include first and second switches 200 and 220 to turn on/off the second amplifier, and third and fourth switches 210 and 230 to turn on/off the fourth amplifier. In particular, the first switch 200 may be arranged between the source of the PMOS2 and the voltage supply stage. The second switch 220 may be arranged between the source of the NMOS2 and the ground stage. The third switch 210 may be arranged between the source of the PMOS4 and the voltage supply stage. The fourth switch 230 may be arranged between the source of the NMOS4 and the ground stage.

Example FIG. 5A has an improved structure to reduce the number of switches used to turn on/off the CSA. That is, this structure can reduce the number of transistors used for switching operation by directly connecting a switch to the drain or source of the CSA.

Similar to the case of example FIG. 4A, in this case, the gates of the PMOS1 and NMOS1 may be connected to each other, and the gates of the PMOS3 and NMOS3 may be connected to each other. Also, the gates of the PMOS2 and NMOS2 may be connected to each other, and the gates of the PMOS4 and NMOS4 may be connected to each other.

Example FIG. 6A is a circuit diagram illustrating a transmitter structure according to embodiments. Example FIG. 6B is a diagram illustrating driving waveforms according to the circuit of example FIG. 6A.

Example FIG. 6A has a structure capable of achieving an increase in the output swing width of the SFA. That is, the structure of example FIG. 6A can increase the output swing width of the SFA by "va" by applying "VDD+va" as the gate voltage of the NMOS transistor and "VSS-va" as the gate voltage of the PMOS transistor.

Meanwhile, in the structure of example FIG. 4A or 5A, the first to fourth switches may be switched off when the phase change of the outputs at the positive and negative nodes is completed, in order to turn off the second and fourth amplifiers.

Assuming that the voltage of the voltage supply stage is VDD, and the voltage of the ground stage is VSS, in the transmitter of embodiments, the maximal voltage applied to the gates of the NMOS1 to NMOS4 is VDD, and the minimal voltage applied to the gates of the PMOS1 to PMOS4 is VSS.

Assuming that the voltage of the voltage supply stage is VDD, the voltage of the ground stage is VSS, and a voltage lower than VDD by a predetermined value is va, the maximal voltage applied to the gates of the NMOS1 and NMOS3 is "VDD+va", and the minimal voltage applied to the gates of the PMOS1 and PMOS3 is "VSS-va". Also, the minimal voltage applied to the gates of the NMOS1 and NMOS3 is not lower than va, and the maximal voltage applied to the gates of the PMOS1 and PMOS3 is not higher than "VDD-va".

In accordance with embodiments, there is an advantage in that it is possible to supply a large current to the output stage upon phase change of an output voltage, and thus to operate the resistive load at the output stage at high speed. Also, it is possible to reduce the overall size of the transmitter because no common-mode feedback circuit is needed.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
  a first amplifying unit including a first amplifier including a first NMOS transistor and a first PMOS transistor, which have a common source connecting the first NMOS transistor and the first PMOS transistor, and a second amplifier including a second PMOS transistor and a second NMOS transistor, which have a common drain connecting the second PMOS transistor and the second NMOS transistor, while being connected with the first amplifier in parallel;
  a second amplifying unit including a third amplifier including a third NMOS transistor and a third PMOS transistor, which have a common source connecting the third NMOS transistor and the third PMOS transistor, and a fourth amplifier including a fourth PMOS transistor and a fourth NMOS transistor, which have a common drain connecting the fourth PMOS transistor and the fourth NMOS transistor, while being connected with the third amplifier in parallel; and
  differential output nodes including a positive node connected to an output stage of the first amplifying unit, to which the common source of the first amplifier and the common drain of the second amplifier are connected, and a negative node connected to an output stage of the second amplifying unit, to which the common source of the third amplifier and the common drain of the fourth amplifier are connected.

2. The apparatus of claim 1, wherein:
a drain of the first NMOS transistor and a source of the second PMOS transistor are connected to a voltage supply stage;
a drain of the first PMOS transistor and a source of the second NMOS transistor are connected to a ground stage;
a drain of the third NMOS transistor and a source of the fourth PMOS transistor are connected to the voltage supply stage; and
a drain of the third PMOS transistor and a source of the fourth NMOS transistor are connected to the ground stage.

3. The apparatus of claim 1, wherein the output stage of the first amplifying unit and the output stage of the second amplifying unit are connected to each other, thereby forming a mirror.

4. The apparatus of claim 1, including:
a resistor having opposite ends, to which the output stage of the first amplifying unit and the output stage of the second amplifying unit are connected, respectively.

5. The apparatus of claim 4, wherein the output stage of the first amplifying unit and the output stage of the second amplifying unit are connected to the opposite ends of the resistor, respectively, thereby forming a mirror.

6. The apparatus of claim 1, wherein:
a gate of the first NMOS transistor and a gate of the first PMOS transistor are connected to each other; and
a gate of the third NMOS transistor and a gate of the third PMOS transistor are connected to each other.

7. The apparatus of claim 1, including:
first and second switches respectively arranged at a gate of the second PMOS transistor and a gate of the second NMOS transistor, to turn on/off the second amplifier.

8. The apparatus of claim 7, including:
third and fourth switches respectively arranged at a gate of the fourth PMOS transistor and a gate of the NMOS transistor, to turn on/off the fourth amplifier.

9. The apparatus of claim 1, wherein:
a gate of the first NMOS transistor and a gate of the first PMOS transistor are connected to each other; and
a gate of the third NMOS transistor and a gate of the third PMOS transistor are connected to each other.

10. The apparatus of claim 1, wherein:
a gate of the second PMOS transistor and a gate of the second NMOS transistor are connected to each other; and
a gate of the fourth PMOS transistor and a gate of the fourth NMOS transistor are connected to each other.

11. The apparatus of claim 1, including:
first and second switches for turning on/off the second amplifier; and
third and fourth switches for turning on/off the fourth amplifier.

12. The apparatus of claim 11, wherein:
the first switch is arranged between a source of the second PMOS transistor and a voltage supply stage;
the second switch is arranged between a source of the second NMOS transistor and a ground stage.

13. The apparatus of claim 11, wherein:
the third switch is arranged between a source of the fourth PMOS transistor and the voltage supply stage; and
the fourth switch is arranged between a source of the fourth NMOS transistor and the ground stage.

14. The apparatus of claim 1, including:
first and second switches respectively arranged at a gate of the second PMOS transistor and a gate of the second NMOS transistor, to turn on/off the second amplifier;
third and fourth switches respectively arranged at a gate of the fourth PMOS transistor and a gate of the NMOS transistor, to turn on/off the fourth amplifier.

15. The apparatus of claim 14, wherein the first to fourth switches are switched off when a phase change of an output at the positive node and a phase change of an output at the negative node are completed, to turn off the second and fourth amplifiers.

16. The apparatus of claim 14, including:
a fifth switch arranged between a source of the second PMOS transistor and a voltage supply stage, to turn on/off the second amplifier;
a sixth switch is arranged between a source of the second NMOS transistor and a ground stage, to turn on/off the second amplifier;
a seventh switch arranged between a source of the fourth PMOS transistor and the voltage supply stage, to turn on/off the fourth amplifier; and
an eighth switch arranged between a source of the fourth NMOS transistor and the ground stage, to turn on/off the fourth amplifier.

17. The apparatus of claim 16, wherein the fifth to eighth switches are switched off when a phase change of an output at the positive node and a phase change of an output at the negative node are completed, to turn off the second and fourth amplifiers.

18. The apparatus of claim 1, wherein a voltage at a voltage supply stage is VDD, and a voltage at a ground stage is VSS, a maximal voltage applied to gates of the first to fourth NMOS transistors is VDD, and a minimal voltage applied to gates of the first to fourth transistors is VSS.

19. The apparatus of claim 1, wherein, a voltage at a voltage supply stage is VDD, a voltage at a ground stage is VSS, a voltage lower than VDD by a predetermined value is va, a maximal voltage applied to gates of the first and third NMOS transistors is VDD+va, and a minimal voltage applied to gates of the first and third PMOS transistors is VSS−va.

20. The apparatus of claim 19, wherein a minimal voltage applied to the gates of the first and third NMOS transistors is not lower than va, and a maximal voltage applied to the gates of the first and third PMOS transistors is not higher than VDD−va.

* * * * *